US011302839B2

(12) United States Patent
Yi et al.

(10) Patent No.: US 11,302,839 B2
(45) Date of Patent: Apr. 12, 2022

(54) INTEGRATED MICRO-LENS FOR PHOTOVOLTAIC CELL AND THERMAL APPLICATIONS

(71) Applicant: The Regents of The University of Michigan, Ann Arbor, MI (US)

(72) Inventors: Ya Sha Yi, Troy, MI (US); Mao Ye, Dearborn, MI (US); Roberto Santinelli, Perugia (IT)

(73) Assignees: THE REGENTS OF THE UNIVERSITY OF MICHIGAN, Ann Arbor, MI (US); DEMETRA ENERGIA SRL, Perugia (IT)

( * ) Notice: Subject to any disclaimer, the term of this patent is extended or adjusted under 35 U.S.C. 154(b) by 0 days.

(21) Appl. No.: 16/038,567

(22) Filed: Jul. 18, 2018

(65) Prior Publication Data

US 2019/0027629 A1    Jan. 24, 2019

Related U.S. Application Data

(60) Provisional application No. 62/534,239, filed on Jul. 19, 2017.

(51) Int. Cl.
  *H01L 31/054* (2014.01)
  *F24S 20/66* (2018.01)
  (Continued)

(52) U.S. Cl.
  CPC .......... *H01L 31/0543* (2014.12); *F24S 20/63* (2018.05); *F24S 20/66* (2018.05);
  (Continued)

(58) Field of Classification Search
  CPC ............................ H01L 31/072; H01L 31/18
  See application file for complete search history.

(56) References Cited

U.S. PATENT DOCUMENTS

| 4,418,238 A | 11/1983 | Lidorenko et al. |
| 5,633,527 A | 5/1997 | Lear |

(Continued)

FOREIGN PATENT DOCUMENTS

| EP | 2515351 A1 | 10/2012 |
| JP | 2015-065211 A | 4/2015 |

(Continued)

OTHER PUBLICATIONS

Vermeersch, et al., WO-2010070621-A1, English Machine Translation (Year: 2010).*

(Continued)

*Primary Examiner* — Tae-Sik Kang
(74) *Attorney, Agent, or Firm* — Harness, Dickey & Pierce, P.L.C.

(57) ABSTRACT

A design for a micro-lens (i.e., a lens on the scale of micrometers) incorporates existing nanofabrication techniques and can be incorporated into High Concentrating Photovoltaic (HCPV), solar thermal collectors, and traditional flat PV systems. Using the theory of wave optics, the design is able to achieve a high numerical aperture, i.e., it can receive light over a wider range of angles. The design also reduces the distance the focal point shifts as the light source shifts; this eliminates the need for a tracking system in CPV and PV applications. Reducing the lens size also facilitates smaller, lightweight CPV systems, which makes CPV attractive for additional applications. Finally, these concentrators reduce the exchanging area of a typical flat solar thermal system where heat is received, which improves the overall system's efficiency and allows its use also during rigid winter time.

8 Claims, 4 Drawing Sheets

(51) Int. Cl.
| | |
|---|---|
| *F24S 20/63* | (2018.01) |
| *F24S 80/56* | (2018.01) |
| *F24S 23/30* | (2018.01) |
| *G02B 19/00* | (2006.01) |
| *H01L 31/052* | (2014.01) |
| *H01L 31/0725* | (2012.01) |
| *F24S 80/60* | (2018.01) |
| *F24S 70/30* | (2018.01) |
| *F24S 23/00* | (2018.01) |

(52) U.S. Cl.
CPC ............... *F24S 23/30* (2018.05); *F24S 80/56* (2018.05); *G02B 19/0028* (2013.01); *G02B 19/0042* (2013.01); *H01L 31/052* (2013.01); *H01L 31/0725* (2013.01); *F24S 23/12* (2018.05); *F24S 70/30* (2018.05); *F24S 80/60* (2018.05)

(56) References Cited

U.S. PATENT DOCUMENTS

| | | | |
|---|---|---|---|
| 2003/0075212 A1* | 4/2003 | Chen | H01L 31/0547 136/246 |
| 2009/0223555 A1* | 9/2009 | Ammar | H02S 40/425 136/246 |
| 2012/0227796 A1 | 9/2012 | Dougherty et al. | |
| 2013/0019931 A1 | 1/2013 | Nayak et al. | |
| 2015/0369976 A1 | 12/2015 | Magnusson | |
| 2017/0098729 A1* | 4/2017 | Fisher | G02B 19/0042 |
| 2017/0139081 A1 | 5/2017 | Wang et al. | |

FOREIGN PATENT DOCUMENTS

| | | | | |
|---|---|---|---|---|
| KR | 2009-0040200 A | 4/2009 | | |
| KR | 2011-0068217 A | 6/2011 | | |
| KR | 101460503 B1 | 11/2014 | | |
| WO | WO-2010070621 A | * 6/2010 | ............... | G05F 1/67 |
| WO | 2014182247 A1 | 11/2014 | | |
| WO | 2016115502 A1 | 7/2016 | | |

OTHER PUBLICATIONS

F. E. Sahin, "Design of Hybrid Refractive/Diffractive Lenses for Wearable Reality Displays", Balkan Journal of Electrical & Computer Engineering, vol. 7, No. 1, Jan. 2019. (Year: 2019).*

International Search Report and Written Opinion dated Nov. 1, 2018 regarding PCT Application No. PCT/US2018/042894.

Arbabi, Amir et al. "Subwavelength-thick lenses with high numerical apertures and large efficiency based on high-contrast transmitarrays." Nature communications 6 (2015).

Sweatt, William et al. "Concentrating photovoltaic systems using micro-optics." Optics for Solar Energy (2011).

Magnusson, Robert. "Wideband reflectors with zero-constraint gratings." Optics Letters 39.15 (2014).

Magnusson, Robert. "Resonance-based nanophotonic device technology: Filters, reflectors, and absorbers." 2016 IEEE Aerospace Conference.

Mao Ye, Yueheng Peng, and Ya Sha Yi. "Silicon-rich silicon nitride thin films for subwavelength grating metalens." Optical Materials Express 1200 vol. 9, No. 3. Mar. 1, 2019.

Mao Ye, Vishva Ray, Yueheng Peng, Wei Guo, and Ya Sha Yi. "Linear polarization distinguishing metalens in visible wavelength." Optics Letters, vol. 44, No. 2. Jan. 15, 2019.

Mao Ye, Vishva Ray, and Ya Sha Yi. "Achromatic Flat Subwavelength Grating Lens Over Whole Visible Bandwidths." IEEE Photonics Technology Letters, vol. 30, No. 10. May 15, 2018.

European Search Report dated Mar. 19, 2021 in European Application No. 18835111.8.

* cited by examiner

INTEGRATED MICRO-LENS FOR PHOTOVOLTAIC CELL AND THERMAL APPLICATIONS

CROSS-REFERENCE TO RELATED APPLICATIONS

This application claims the benefit of U.S. Provisional Application No. 62/534,239, filed Jul. 19, 2017. The entire disclosure of the above application is incorporated herein by reference.

FIELD

The present disclosure relates to solar technology and, more particularly, relates to an integrated micro-lens for both concentrated and traditional photovoltaic cells and thermal applications.

BACKGROUND AND SUMMARY

This section provides background information related to the present disclosure which is not necessarily prior art. This section further provides a general summary of the disclosure, and is not a comprehensive disclosure of its full scope or all of its features.

Traditionally, solar panels employ photovoltaic cells that generate power from sunlight. Current solar technologies are mainly based on silicon photovoltaic technologies, which show strong limitation in terms of effective conversion of photons into conduction electrons. The limitation mainly derives both from quantum-physics reasons and from classical optical considerations.

Quantum-physics affects the power generation by limiting the photon conversion only to specific frequencies of the incident light among the AM1.5 solar spectrum and—specifically—to ones matching the energy band gap between valence and conduction electrons of a Silicon p-n junction (1.1 eV). With the advent of the third generation of photovoltaic and the use of multijunction solar cells, the limitation of specific frequencies of the solar spectrum has been partially addressed. However, the prohibitive costs of rare materials used to manufacture these special solar cells brought to the need of reducing significantly their use and thus the concept of concentrated photovoltaics technology (CPV).

The optical limitation of current solar technologies is best explained with the concept of "the cosine effect." That is, a non-optimally oriented solar module receives an amount of solar radiation lower than a solar module that is perfectly oriented relative to the incident light. The factor is the cosine of the angle formed between the direction of the incident light and the normal direction of the solar module. Proportionally, the power generated is reduced by this factor. This is the reason why the daily power curve of a fixed solar installation resembles the typical Gaussian-line shape, instead of a "rectangle-like" shape as bi-axially tracked photovoltaics show. Secondary effects as electron-hole recombination due to thermal agitation of the atomic solar cell structure, soiling of the solar module surface, and reflection effects that also affect the capability of capturing the light are not considered despite also mitigated by the novel optics according to the principles of the present teachings.

Concentrated photovoltaics (CPV) use lenses and curved mirrors to focus sunlight onto small, but highly efficient, solar cells. In conventional systems, as the Sun moves, the focus point of the concentrator moves, which reduces the power collected or requires the use of complex and expensive tracking systems. Moreover, conventional systems are often large and heavy, thereby reducing their applications. Conventional CPV strongly depends on the DNI (Directly Normal Incident) component of the global radiation and simply cannot work in diffuse radiation conditions. This poses a strong limitation on the suitable geographical locations where the CPV can be effectively installed (i.e. sun belt regions only), thereby limiting, inhibiting, or otherwise preventing this emerging technology from penetrating world-wide solar markets.

Typically, CPV applications include a solar concentrator that uses lenses or mirrors, a tracking mechanism, solar cells, and a heat sink. The tracking system is typically required to permit adjustable tracking of the sun to improve solar efficiency. However, most installations generally provide less than 5 MW of output with an average selling price of $2.90 per Watt in 2013. Thus, capital expenditures (CAPEX) and operation expenses (OPEX) of conventional CPV systems thus, again, limit, inhibit, or otherwise prevent penetration in world-wide solar market.

Generally, solar photovoltaic (PV) market drivers include government incentives, falling prices of solar PV modules, concerns over carbon emissions, low installation and maintenance cost versus wind, and hydroelectric. On the other hand, solar PV market restraints include climate restricted feasibility areas, reduced feed-in tariffs, and oversupply.

Separately, but related, current solar thermal technology (e.g. solar thermal collectors) suffers from solar thermal related problems that dramatically affect operational sizing capacity and efficiency, namely low energy production during cold-winter season that prevents exploiting solar systems for the production of hot water or, conversely, the overheating problem in hot summer season when energy demands are lower than the potential energy production offered by the Sun. These two aspects dramatically impact the correct sizing of each solar thermal project.

More particularly, sizing of solar thermal collectors is often a balancing of a systems heat receiving capability versus the need to dissipate heat. That is, with reference to FIG. 1, a surface A is exposed to incident radiation from a source (e.g. Sun) on the left side. The energy received by the Sun is proportional to the surface area of surface A. From the same surface A, the warmed body, accordingly to Wien Law, loses energy due to different processes such as re-irradiation, convention and conduction (i.e. heat transfer). The amount of energy lost follows Fourier's law:

$$Q = \frac{kA(T_{Hot} - T_{Cold})t}{d}$$

where Q is energy lost, k is from measurement of material's ability to conduct heat, A is area exposed to ambient, $T_{hot}$ is the temperature of a hot body, $T_{cold}$ is the temperature of a cold body (e.g. ambient), t is time exposed to the ambient, and d is material thickness.

That is, this formula takes into account the factors contributing to the thermal equilibrium between two bodies at different temperatures. The passage of heat from a warm body to a cooler one succeeds until the temperatures of the two becomes the same. The energy loss proportional to the exchange surface A.

For solar thermal collectors, this is a straightforward conclusion—all solar collector manufacturers would like to have more area A receiving sunlight, but at the same time they would also aim to have less area A in order to reduce related heat losses.

Accordingly, the teachings according to the principles of the present invention employ a new design for a micro-lens (i.e., a lens on the scale of micrometers or smaller) based on nano-scale fabrication methods and a zero contrast grating design to improve operation of PV and CPV applications. In some embodiments, the present teachings provide numerous benefits compared to conventional systems, including, but not limited to, improved angular efficiency (i.e., less power loss from shifting focal point of the light); lighter, smaller, more compact cells; reduced heat loss in solar thermal applications; and the eliminations of the need for a tracking system.

Moreover, these teachings provide an easily implementable application of the present optics made possible through the optical behavior of the micro-lens assembly can dramatically mitigate the aforementioned trade—between maximizing area A to receive sunlight and minimize area A to reduce related heat loss to generate groundbreaking behavior (described as a thermal diode in connection herewith).

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
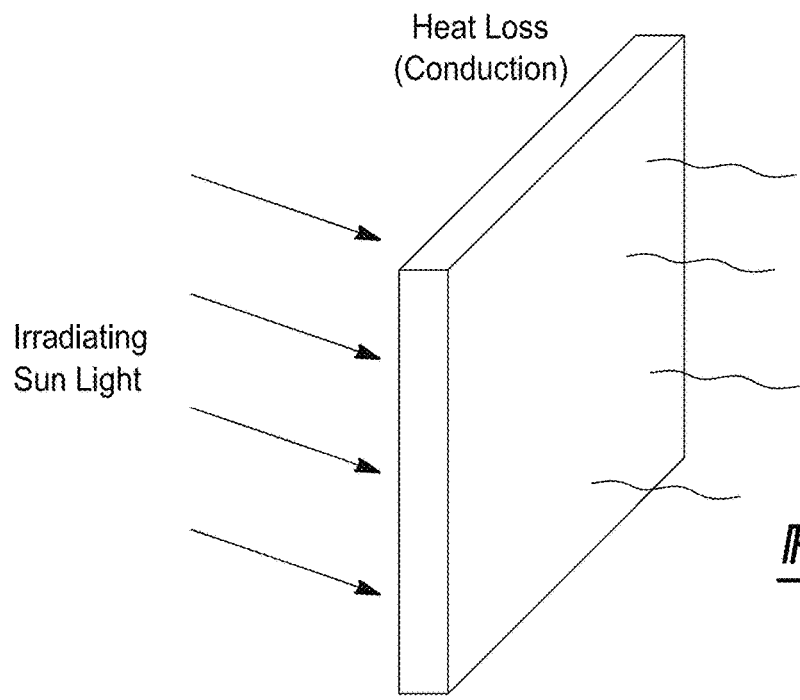
FIG. 1 illustrates the heat transfer response of a surface exposed to incident radiation.

Example embodiments will now be described more fully with reference to the accompanying drawings. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

As previously provided, conventional CPV are often big, heavy, and space consuming, and the substantial change in focused point can greatly affect the efficiency of the system. Accordingly, these factors (namely, weight, space requirements and light deflection) greatly impede the application of CPV. According to the teachings of the present invention, modern nano-fabrication techniques enable structures to be fabricated in subwavelength scale. By utilizing the theories of wave optics, concentrating lenses are designed in nano-scale with high numerical aperture (NA) for use in PV and CPV application and provide numerous benefits compared to conventional systems, including, but not limited to, improved angular efficiency (i.e., less power loss from shifting focal point of the light); lighter, smaller, more compact cells; reduced heat loss in solar thermal applications; and the eliminations of the need for a tracking system.

Figure 2:
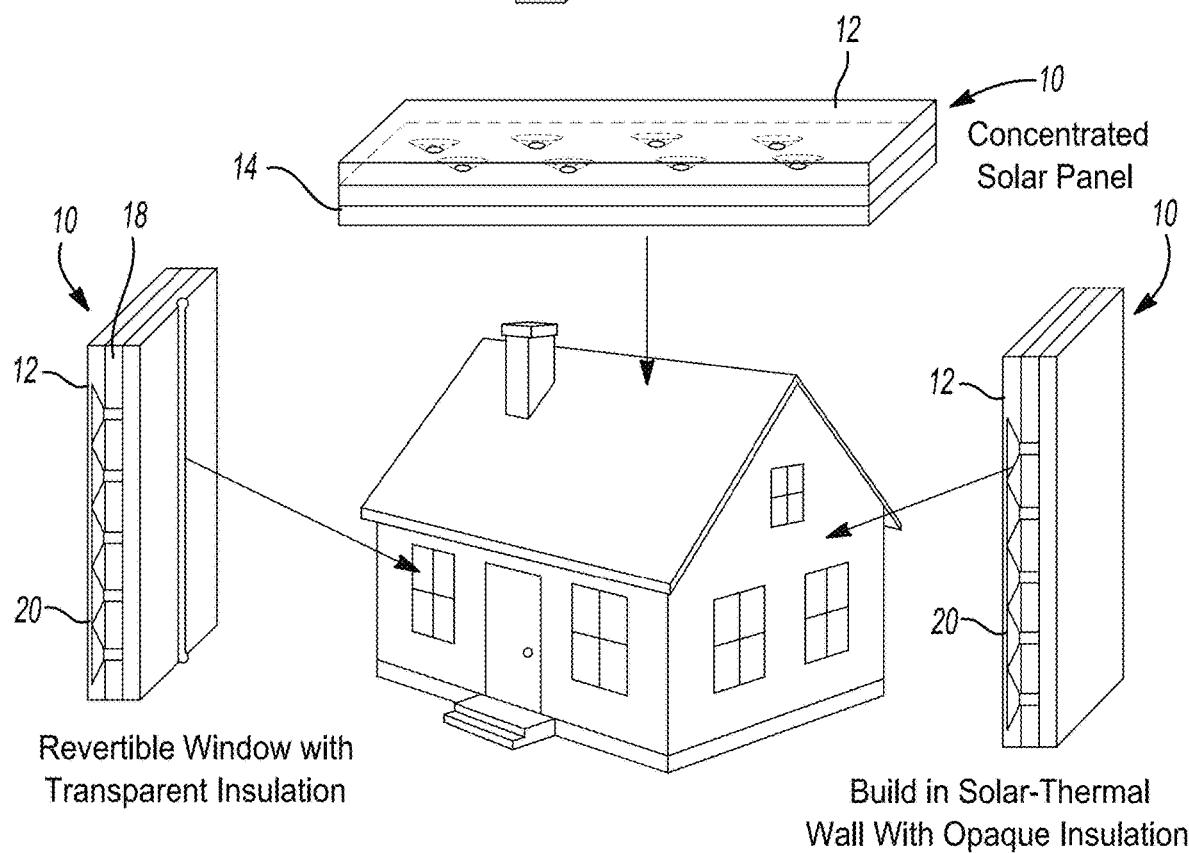
FIG. 2 illustrates solar assemblies according to various embodiments of the present invention.
Figure 3:
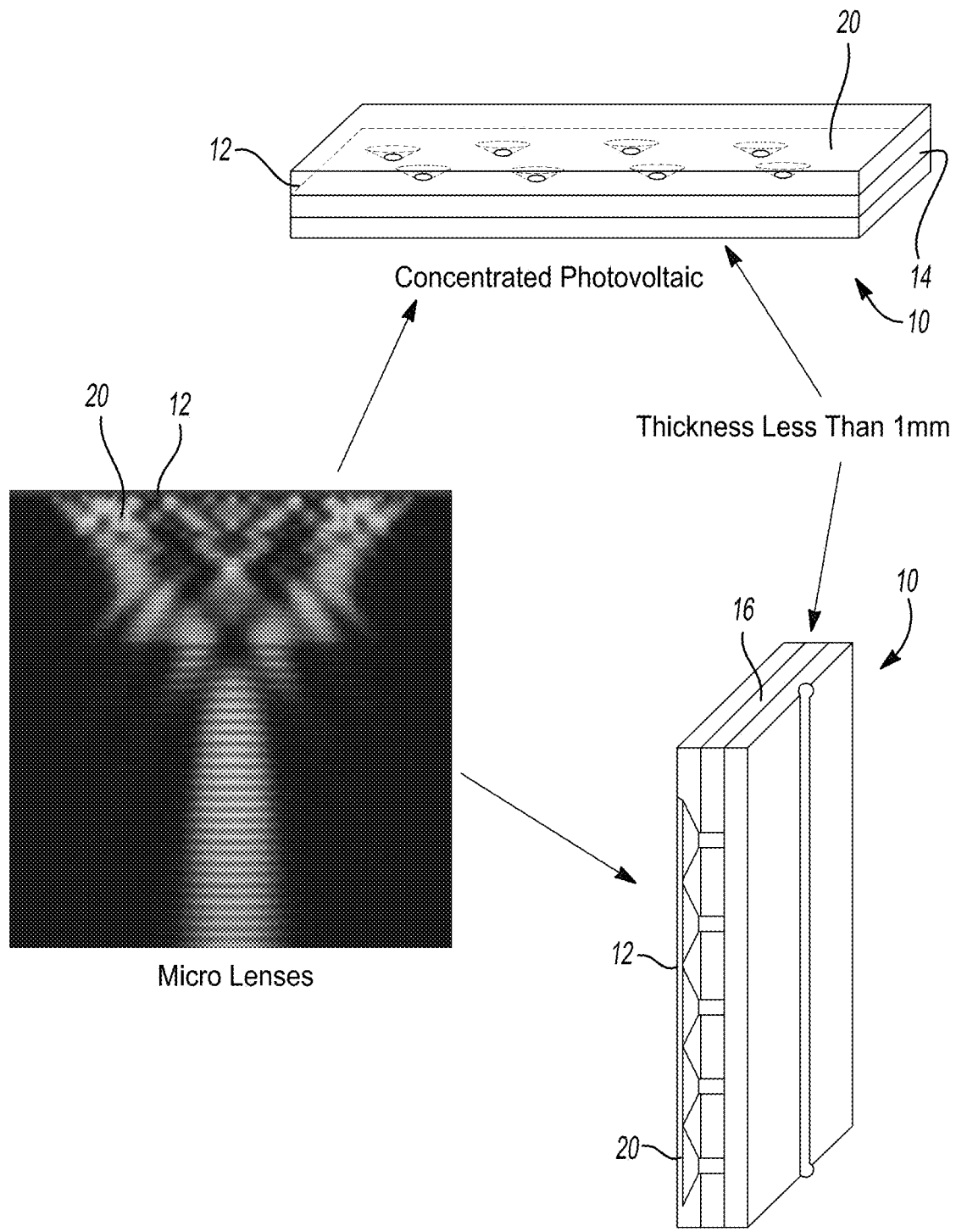
FIG. 3 illustrates micro lenses layer in association with concentrated photovoltaics and concentrated solar thermal systems.
Figure 4:
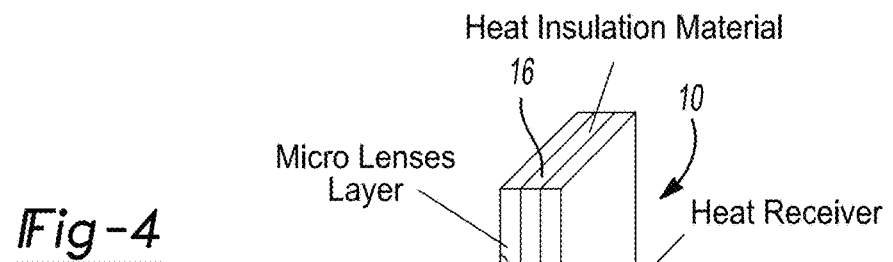
FIG. 4 illustrates a side view of a solar thermal system according to the principles of the present invention.
Figure 5:
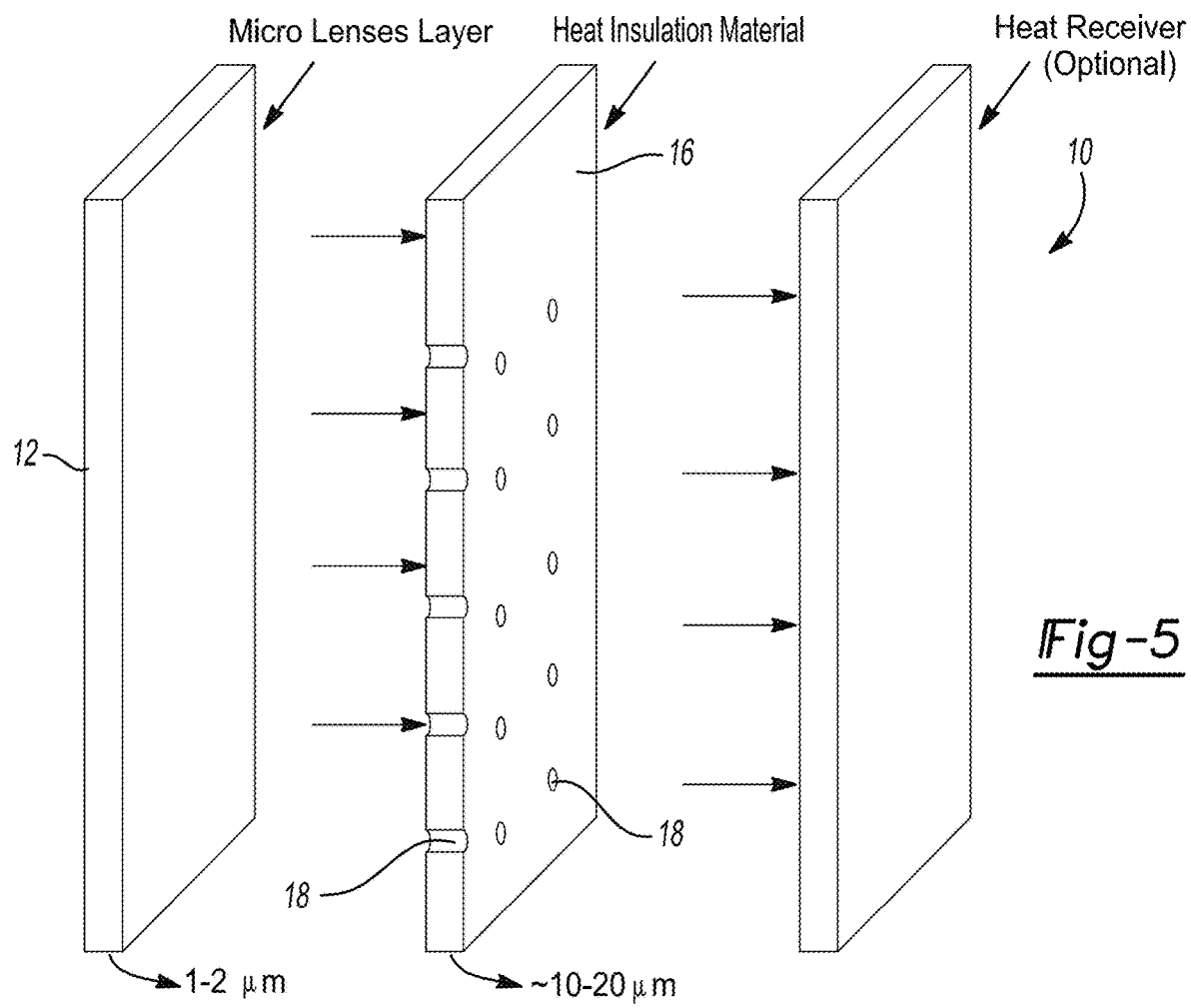
FIG. 5 illustrates an exploded side view of a solar thermal system according to the principles of the present invention.
Figure 6:
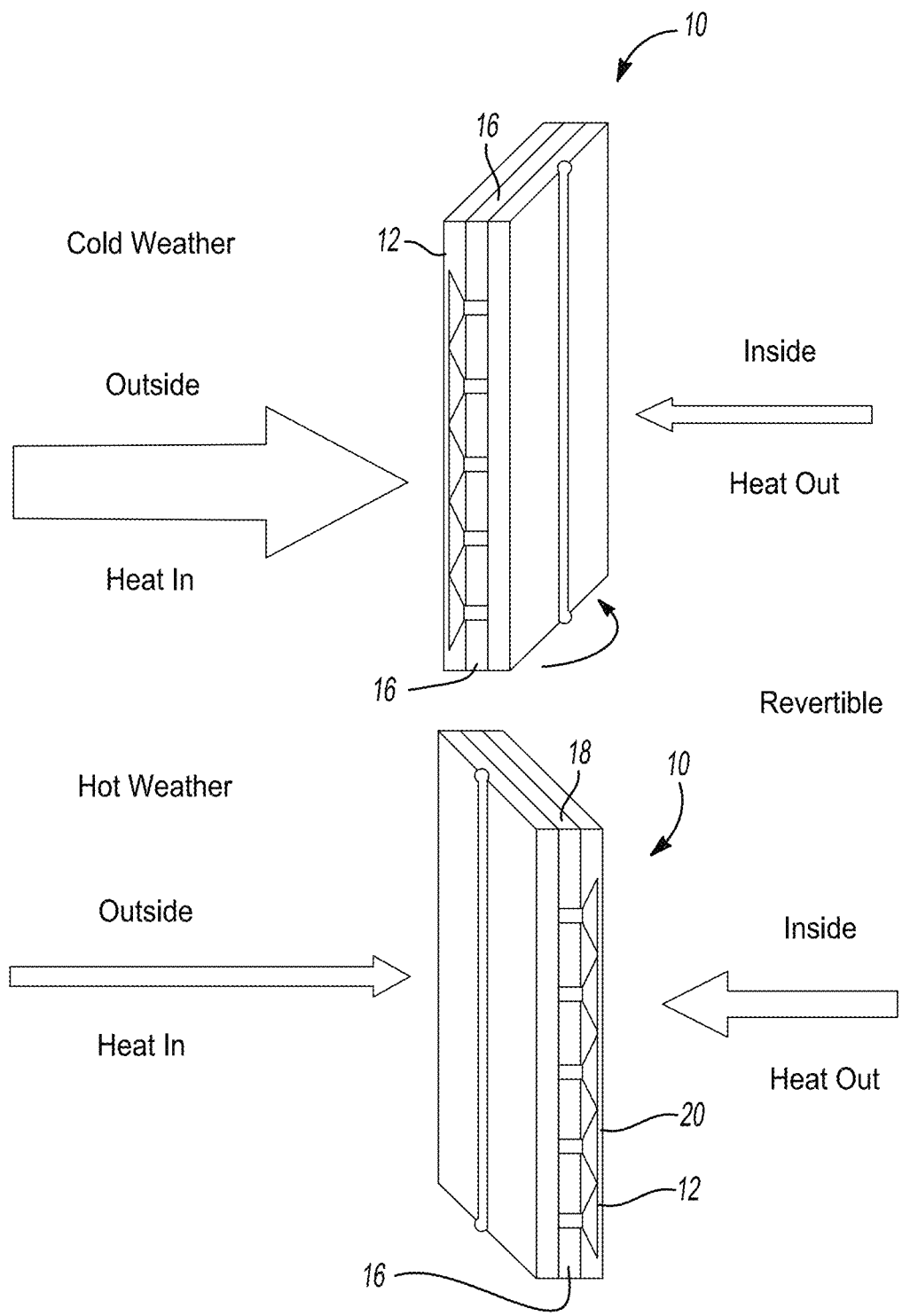
FIG. 6 illustrates a reversible solar thermal system according to the principles of the present invention.

With particular reference to FIGS. 2-6, a solar assembly 10 having advantageous construction according to the principles of the present teachings is provided. In some embodiments, solar assembly 10 can comprise a concentrated solar panel having a micro lenses layer 12, a solar cells layer 14 (e.g. monocrystalline Si solar cells), and an electronic control system configured to manage the power generated by solar cell layer 14. In some embodiments, solar cells layers 14 can comprise a concentrated photovoltaic (CPV) system. Moreover, in some embodiments, solar assembly 10 can comprise a concentrated solar thermal assembly having micro lenses layer 12, a heat insulating layer 16, and a plurality of waveguides 18 extending through heat insulating layer 16.

In some embodiments, micro lenses layer 12 comprises a substrate deposited at a predetermined deposition rate and defining a predetermined grating thickness. Micro lenses layer 12 includes a plurality of micro lenses 20. In some embodiments, each of the plurality of micro lenses 20 has a radius less than about 10 microns and, in some embodiments, a radius that ranges from microns to millimeter based on the application. The micro lenses layer 12 is configured to receive radiation energy and focus the radiation energy at a focusing region along discrete paths toward solar cells layers 14 and/or the plurality of waveguides 18. In some embodiments, the micro lenses 20 demonstrated may have a focal length of 3 mm (3 mm×tan 15°=0.000803 m (0.803 mm)). If we assume a conventional CPV has a focal length of 1 m (1 m×tan 15°=0.26 m), the light deflection in the PV or CPV is decreased from 0.26 m to 0.803 mm—the deflection less than 1 millimeter can hardly be observed by eye. While with Nano CPV (NCPV), the focal length can be 10 to 1 µm. NCPV layer concentrate light to the grid of designed spot, which is then matched by the grid of PV material, which can be Silicon, GaAs, and perovskite.

In some embodiments, the feature size of the micro lens 20 (e.g. smallest grating or nano post) can be tens of nanometers to hundreds of nanometers, which is based on the targeting wavelength. The targeting wavelength ranges from deep UV to radio frequency, which is a dependent of specific environment and application. The material of micro lens 20 ranges from transparent dielectric materials, including $TiO_2$, $SiO_2$, silicon nitride, silicon rich nitride and polymers, to semiconductors, including silicon and GaN Micro-Solar Cells With the improvement in performance, cost, and capabilities of these systems—ranging from structures for light trapping to advanced doping techniques, innovative spherical, rectangular, and ultrathin cell designs and advanced manufacturing techniques—the present technology enables one to create and manipulate monocrystalline Si solar cells that are much thinner (down to about 100 nm, or limited only by junction depth) and smaller (down to a few micrometers). Such, ultrathin and ultra-small designs lead to solar modules that are small in size and light weight, which consequently adds to the flexibility for integrating them to any surface. Moreover, the sub-wavelength structure enables their use in transparency engineering.

That is, nano-micro lenses system has its advantage of subminiature, light-weight, and anti-deflection, which thus enables the integration of CPV on most of the surface that is desirable without the concern about weight and space (building walls, wearable devices & etc.). Still further, with the application of micro lenses, solar thermal devices can achieve one-direction heat insulation.

In some embodiments, micro lenses layer 12 can comprise an array of the plurality of micro lenses 20 arranged as constructive interfering optics. In some embodiments, this assembly can be arranged to comprise a multifunctional anti reflection coating layer (ARC) that can be placed directly on the solar glass of, for example, solar cell layer 14. The innovative anti-reflection coating layer, specifically engineered for flat PV applications, through its light-bending behavior demonstrated the absolute independence of the density of the captured light from its provenance on the underlying surface of the coating, which is reorganized orthogonally to the receiving surface. This allows the underlying solar cell layer 14 of a flat PV solar module to receive in an always orthogonal direction the light from the Sun, at whichever hour of the day.

While of course the global intensity of the radiation hitting the solar cells layer 14 will still be equal to the radiation density times the geometrical surface exposed to the radiation—which will thus decrease with the cosine of the angle between the light and the normal axis of the solar panel—the possibility to redirect all available sunlight hitting the Antireflection Coating Layer (aka micro lenses layer 12) always normally to the p-n junction introduces important benefits in terms of reduction of internal micro-reflections otherwise happening thorough the texturing which features the external surface of the solar cells which cause important loss of energy potentially photo-convertible into electricity.

Furthermore, the proven capability of selecting the incoming frequencies of the light by varying the geometry of the nano-structures of the plurality of micro lenses 20, will also introduce extra-benefits to the performance of solar cells layer 14. With a specific geometry and period of our nanostructures it has been demonstrated that the transmittance of the infrared frequencies of the solar spectrum is significantly reduced. Accordingly, the heat passing through, which causes a degradation of the performances of the solar cells by at least 0.3% every Celsius degree with respect to the standard conditions, is reduced. The coating acts in this case as heat sink enhancing the overall system photoconverting system performances.

Finally, the capability of reorganizing the incident light in an always orthogonal direction finds immediate applications in the "traditional" CPV and HCPV (High Concentrating Photovoltaic) industry. Micro lenses layer 12, having the periodic grid array of micro lenses 20 ensures that radiation is transmitted to the underlying surface of traditional Fresnel focusing lenses is always orthogonal. This results in elimination of the need to use expensive tracking systems to precisely orient solar assembly 10 throughout the day. Furthermore, micro lenses layer 12 further enables even existing (H)CPV systems to work under any climatic condition by removing the current restraints preventing this technology to work outside sun belt regions. The existing HCPV technology, equipped with the micro lenses layer 12 results in a highly cost-competitive solar technology.

In manufacturing, CPVs can possibly save 75% of PV material, while the NCPV technique enabling one to minimize the size to a layer less than 1 mm and weight of merely grams. By dramatically decreasing the size and weight of CPV systems, Nano CPV can expand its application to nearly every facet of life.

In summary, the micro lenses layer 12 of the present teachings can form the top layer of a solar cell, thereby providing a new micro grid contact layer to further improve the performance of microlens—solar cell system. The micro grid is formed by conductive material that covers the edges of individual lens among the lens array, which forms a conductive grid contact layer. Compared with traditional contact layers, the coverage of micro grid layer is much more complete and thus promises higher efficiency.

Moreover, the present teachings provide an anti-reflection coating layer for flat PV applications built of micro-lenses layer having a substrate deposited at a predetermined deposition rate and defined a predetermined grating thickness, the micro lenses layer having a plurality of micro lenses each having a radius less than about 10 microns. The constructive interference of these microlenses enable capture of the light at any angles between −30 and +30 degrees and to transmit down to the underlying glass along the orthogonal direction of the layer plan with a selective filtering of infrared components of the solar spectrum. The coating can be either fabricated as a sticky film on a flexible substrate (i.e. PEN, PET or Kapton or any other convenient material) that will allow a post-market retrofitting installation of the invention on existing modules or directly on the solar glass that will be mounted on the new PV solar module at the solar factories.

The expected shelf life is more than 10 years. The large scale fabrication techniques will comply with current CMOS standards.

Still further, the present teachings provide a solar thermal collector with heat insulation layer in front of the heat exchange surface operably coupled to the micro and/or milli lenses layer to define a variable combined thickness assembly of layers. This permits a reduction of the heat exchanging area of the current flat solar collectors preserving at the same time the receiving area thus permitting to operate solar thermal collectors also during winter seasons. In some embodiments, the present invention will replace the existing solar glass of the solar thermal modules on top of the underlying heat exchanger and will consist on an assembly of different technologies built of:

An optical layer—receiving the sunlight—built as an array of micro-milli lenses each of them focusing a portion of total hitting radiation into specific optical paths. The thermal concentration is between 50 to 200 suns.

A variable thickness insulating layer preventing the heat to escape in the inner-to-outer direction, mechanically coupled with the optical layer. Material and thickness of this layer would depend on the level of insulation attainable.

A set of wavelength guides optically coupled to each focusing micro and/or milli lens, crossing the insulating layer and thus insuring the flow of the radiation in the outer-to-inner direction. The focused light passing through these optical guides will reach directly the underlying heat exchanger.

In some embodiments, a new Anti-reflection Coating layer for existing (H)CPV applications is provided, built of a micro-lenses layer having a substrate deposited at a predetermined deposition rate and a defined predetermined grating thickness. The micro lenses layer having a plurality of micro lenses each having a radius less than about 10 microns. The constructive interference of these micro lenses will permit to capture the light at any angles between −30 and +30 degrees and to transmit down to the underlying Fresnel focusing element in an orthogonal direction. This implementation on existing and/or new (H)CPV systems will allow one to exploit the concentrating photovoltaic at any climatic conditions, exploit diffuse radiation, and eliminate the need of installing CPV modules on expensive tracking systems. The coating can be either fabricated as a sticky film on a flexible substrate (i.e. PEN, or PET or Kapton) that will allow a post-market retrofitting installation of the invention on existing modules or directly on the solar glass that will be mounted on the new (H)CPV solar module at the solar factories. The shelve life is more than 10 years. The large scale fabrication techniques will be current CMOS standard.

According to these teachings, an individual microlens can concentrate light of different wavelengths to focus points with different focal length along its central axis based on its engineering. When integrated with micro-multijunction solar cell, the microlens can be designed to create focuses on the selected layers (of micro-multijunction solar cell) with wavelength of this layer's highest efficiency). For example, there is a micro-multijunction solar cell with two layers. The upper layer has highest quantum efficiency at wavelength around 685 nm and the lower layer has highest quantum efficiency at wavelength around 420 nm. With a micro lens engineered on top of this solar cell, the 685 nm part of light will be focused on the top layer and the 420 nm part of light will be focused on the lower layer, thus greatly increased the overall quantum efficiency of the micro-multijunction solar cell.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A concentrate photovoltaic system comprising:
   a flat micro lenses layer having a flat incident functional surface and a substrate, the flat micro lenses layer having a plurality of micro concentrator lenses each having a radius ranging from microns to millimeter, the flat micro lenses layer configured to receive radiation energy in wavelengths ranging from deep UV to radio frequency and focus the radiation energy at first and second focal lengths within a focusing region each based on the wavelengths of the radiation energy, the plurality of micro concentrator lenses being made of a transparent dielectric material or semiconductor;
   a micro-multijunction solar cell having first and second layers, said first layer matching the first focal length within the focusing region, said second layer matching the second focal length within the focusing region, the micro-multijunction solar cell configured to output power in response to the radiation energy; and
   an electronic system configured to manage the outputted power generated by the micro-multijunction solar cell.

2. The concentrate photovoltaic system according to claim 1, wherein the plurality of micro concentrator lenses are configured to capture light at an angle between −30 degrees to +30 degrees relative to an orthogonal axis extending to the micro-multijunction solar cell.

3. The concentrate photovoltaic system according to claim 1, wherein the flat micro lenses layer is adhesively coupled to the micro-multijunction solar cell.

4. The concentrate photovoltaic system according to claim 1, wherein the flat micro lenses layer is integrally formed with the micro-multijunction solar cell.

5. The concentrate photovoltaic system according to claim 1 further comprising:
   a heat insulation assembly comprising the flat micro lenses layer focusing the radiation energy at the focusing region along discrete paths and an insulating layer disposed adjacent the flat micro lenses layer, the insulating layer inhibiting heat transfer in a direction from the micro-multijunction solar cell to the flat micro lenses layer, the insulating layer having a plurality of waveguides extending therethrough, each of the plurality of waveguides optically coupled to a corresponding one of the plurality of micro concentrator lenses permitting flow of the radiation energy therethrough to the micro-multijunction solar cell.

6. The concentrate photovoltaic system according to claim 1 wherein each of the plurality of micro concentrator lenses has a radius less than about 10 microns.

7. The concentrate photovoltaic system according to claim 1 wherein the transparent dielectric material is selected from the group consisting of $TiO_2$, $SiO_2$, silicon nitride, silicon rich nitride and polymers.

8. The concentrate photovoltaic system according to claim 1 wherein a material of the semiconductor is selected from the group consisting of silicon and GaN.

* * * * *